(12) United States Patent
Zhang et al.

(10) Patent No.: US 10,510,567 B2
(45) Date of Patent: Dec. 17, 2019

(54) INTEGRATED SUBSTRATE TEMPERATURE MEASUREMENT ON HIGH TEMPERATURE CERAMIC HEATER

(71) Applicant: Applied Materials, Inc., Santa Clara, CA (US)

(72) Inventors: Yizhen Zhang, San Jose, CA (US); Rupankar Choudhury, Karnataka (IN); Jay D. Pinson, II, San Jose, CA (US); Jason M. Schaller, Austin, TX (US); Hanish Kumar Panavalappil Kumarankutty, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/970,496

(22) Filed: May 3, 2018

(65) Prior Publication Data

US 2018/0323093 A1    Nov. 8, 2018

Related U.S. Application Data

(60) Provisional application No. 62/500,682, filed on May 3, 2017.

(51) Int. Cl.
*H01L 21/67* (2006.01)
*G02B 6/42* (2006.01)
(Continued)

(52) U.S. Cl.
CPC .... *H01L 21/67248* (2013.01); *C23C 16/4581* (2013.01); *C23C 16/4586* (2013.01);
(Continued)

(58) Field of Classification Search
CPC ......... H01L 21/67248; H01L 21/67109; H01L 21/68792; C23C 16/4581; C23C 16/4586; C23C 16/463; C23C 16/52; H01J 37/00
(Continued)

(56) References Cited

U.S. PATENT DOCUMENTS 5,253,312 A * 10/1993 Payne .................. A61B 18/22
                                                                     385/31
5,317,656 A    5/1994 Moslehi et al.
(Continued)

FOREIGN PATENT DOCUMENTS

WO    WO-2015187389 A2 * 12/2015 ........ H01J 37/32192

OTHER PUBLICATIONS

PCT International Search Report and Written Opinion dated Sep. 11, 2018, for International Application No. PCT/US2018/030899.

*Primary Examiner* — Charlee J C Bennett
(74) *Attorney, Agent, or Firm* — Patterson + Sheridan LLP

(57) ABSTRACT

Embodiments described herein include integrated systems used to directly monitor a substrate temperature during a plasma enhanced deposition process and methods related thereto. In one embodiment, a substrate support assembly includes a support shaft, a substrate support disposed on the support shaft, and a substrate temperature monitoring system for measuring a temperature of a substrate to be disposed on the substrate support. The substrate temperature monitoring system includes a optical fiber tube, a light guide coupled to the optical fiber tube, and a cooling assembly disposed about a junction of the optical fiber tube and the light guide. Herein, at least a portion of the light guide is disposed in an opening extending through the support shaft and into the substrate support and the cooling assembly maintains the optical fiber tube at a temperature of less than about 100° C. during substrate processing.

14 Claims, 3 Drawing Sheets

(51) Int. Cl.
*G01J 5/00* (2006.01)
*C23C 16/458* (2006.01)
*C23C 16/46* (2006.01)
*G01J 5/02* (2006.01)
*G01J 5/04* (2006.01)
*C23C 16/52* (2006.01)
*H01J 37/32* (2006.01)
*G01J 5/06* (2006.01)
*H01L 21/687* (2006.01)
*G01J 5/08* (2006.01)

(52) U.S. Cl.
CPC ............ *C23C 16/463* (2013.01); *C23C 16/52* (2013.01); *G01J 5/0007* (2013.01); *G01J 5/0255* (2013.01); *G01J 5/042* (2013.01); *G01J 5/046* (2013.01); *G01J 5/048* (2013.01); *G01J 5/061* (2013.01); *G01J 5/0818* (2013.01); *G01J 5/0821* (2013.01); *G02B 6/4268* (2013.01); *H01J 37/32724* (2013.01); *H01L 21/67109* (2013.01); *H01L 21/68792* (2013.01)

(58) Field of Classification Search
USPC .................... 118/715–733; 156/345.1–345.55
See application file for complete search history.

(56) References Cited

U.S. PATENT DOCUMENTS

| | | | | |
|---|---|---|---|---|
| 5,355,425 A * | 10/1994 | Braiman | ............ | G01N 21/552 385/12 |
| 5,556,204 A * | 9/1996 | Tamura | ................. | C23C 14/541 250/234 |
| 5,597,398 A * | 1/1997 | Ishikawa | ............. | C03B 37/0148 65/413 |
| 5,755,511 A * | 5/1998 | Peuse | .................... | G01J 5/0003 374/128 |
| 5,830,277 A * | 11/1998 | Johnsgard | ............. | C23C 16/481 118/725 |
| 5,893,643 A * | 4/1999 | Kumar | .............. | H01L 21/67248 374/131 |
| 6,086,246 A * | 7/2000 | Shufflebotham | ........ | G01J 5/041 374/121 |
| 6,107,606 A * | 8/2000 | Hotchkiss | ............... | H01L 21/56 219/411 |
| 6,226,453 B1 * | 5/2001 | Yam | ....................... | G01J 5/0003 392/418 |
| 6,481,886 B1 | 11/2002 | Narendrnath et al. | | |
| 6,695,886 B1 * | 2/2004 | Brown | .................. | G01J 5/0003 219/390 |
| 2001/0021297 A1 * | 9/2001 | Akira | ................... | G02B 6/4296 385/116 |
| 2003/0176000 A1 | 9/2003 | Otsubo et al. | | |
| 2004/0184028 A1 * | 9/2004 | Fink | ................... | H01J 37/32862 356/72 |
| 2009/0022205 A1 * | 1/2009 | Comendant | ............ | G01K 1/143 374/161 |
| 2009/0274590 A1 | 11/2009 | Willwerth et al. | | |
| 2010/0206482 A1 * | 8/2010 | Matsudo | ............... | G01J 5/0003 156/345.27 |
| 2015/0001401 A1 * | 1/2015 | Ramsden | .................. | G01T 1/20 250/362 |
| 2015/0221535 A1 | 8/2015 | Nguyen et al. | | |
| 2016/0011060 A1 * | 1/2016 | Bergen | ................... | G01K 11/32 219/444.1 |
| 2016/0302258 A1 | 10/2016 | Hayashi et al. | | |
| 2017/0316963 A1 * | 11/2017 | Parkhe | ............. | H01L 21/67115 |
| 2017/0362712 A1 * | 12/2017 | Yadav | ..................... | C23C 16/52 |

* cited by examiner

INTEGRATED SUBSTRATE TEMPERATURE MEASUREMENT ON HIGH TEMPERATURE CERAMIC HEATER

CROSS-REFERENCE TO RELATED APPLICATIONS

This application claims priority to U.S. Provisional Application Ser. No. 62/500,682, filed May 3, 2017, which is herein incorporated by reference in its entirety.

BACKGROUND

Field

Embodiments described herein generally relate to plasma enhanced semiconductor device manufacturing processes, and more specifically to a substrate temperature monitoring system used in a plasma enhanced chemical vapor deposition chamber (PECVD) and methods related thereto.

Description of the Related Art

Semiconductor device manufacturing involves a number of different chemical and physical processes enabling minute integrated circuits to be created on a substrate. Layers of materials, which make up the integrated circuit, are created by chemical vapor deposition, physical vapor deposition, epitaxial growth, and the like.

In the manufacture of integrated circuits, plasma enhanced processes are often used for deposition or etching of various material layers. Plasma enhanced processing offers many advantages over thermal processing. For example, plasma enhanced chemical vapor deposition (PECVD) allows deposition processes to be performed at lower temperatures and at higher deposition rates than achievable in analogous thermal processes. Thus, PECVD is advantageous for semiconductor device manufacturing processes with stringent thermal budgets, such as for back end of the line (BEOL) processes for very large scale or ultra-large scale integrated circuit (VLSI or ULSI) device fabrication.

Typically, during plasma enhanced processing of a substrate within a processing chamber, ions form the plasma will bombard the substrate causing undesirable temporal temperature increases, e.g., temperature spikes, thereof. Conventional methods of monitoring substrate temperature during substrate processing in a plasma enhanced chamber typically rely on measuring the temperature of a substrate support, the substrate disposed thereon, and inferring the temperature of the substrate from the temperature of the substrate support. Unfortunately, the low pressure atmosphere of many plasma enhanced processes causes poor heat transfer between the substrate and the substrate support which results in a large temperature differential therebetween.

Accordingly, there is a need in the art for apparatus and methods to directly monitor the temperature of a substrate during plasma enhanced substrate processes.

SUMMARY

Embodiments described herein provide a substrate temperature monitoring system used in a semiconductor device manufacturing system, in particular, a temperature monitoring system for directly monitoring the temperature of a substrate during a plasma enhanced deposition process, such as a plasma enhanced chemical vapor deposition (PECVD) process, and methods related thereto.

In one embodiment, a substrate support assembly includes a support shaft, a substrate support disposed on the support shaft, and a substrate temperature monitoring system for measuring a temperature of a substrate to be disposed on the substrate support. The substrate temperature monitoring system includes an optical fiber tube, a light guide coupled to the optical fiber tube, and a cooling assembly disposed about a junction of the optical fiber tube and the light guide. Herein, at least a portion of the light guide is disposed in an opening extending through the support shaft and into the substrate support and the cooling assembly maintains the optical fiber tube at a temperature of less than about 100° C. during substrate processing.

In another embodiment, a processing chamber includes a chamber body defining a processing volume and a substrate support assembly disposed in the processing volume. The substrate support assembly includes a support shaft, a substrate support disposed on the support shaft, and a substrate temperature monitoring system for measuring a temperature of a substrate to be disposed on the substrate support. The substrate temperature monitoring system includes an optical fiber tube, a light guide coupled to the optical fiber tube, and a cooling assembly disposed about a junction of the optical fiber tube and the light guide. Herein, at least a portion of the light guide is disposed in an opening extending through the support shaft and into the substrate support and the cooling assembly maintains the optical fiber tube at a temperature of less than about 100° C. during substrate processing.

In another embodiment, a method of processing a substrate includes positioning a substrate on a substrate receiving surface of a substrate support assembly disposed in a processing volume of a processing chamber, flowing one or more processing gases into the processing volume, forming a plasma of the one or more processing gases, measuring a temperature of the substrate using an optical fiber tube, wherein the temperature of the substrate exceeds about 110° C., and wherein the optical fiber tube is maintained at a temperature less than about 100° C., and depositing a material layer on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Embodiments described herein provide a substrate temperature monitoring system used in a plasma enhanced processing chamber, in particular, a temperature monitoring system for directly monitoring the temperature of a substrate during a plasma enhanced deposition process, such as a plasma enhanced chemical vapor deposition (PECVD) process, and methods related thereto.

Conventionally, during a plasma enhanced deposition processes, such as PECVD processes, the temperature of a substrate being processed is monitored by measuring the temperature of a substrate support, having the substrate disposed thereon, and inferring the temperature of the substrate therefrom. Unfortunately, indirect measurements of the substrate temperature are often inaccurate due to poor heat transfer between the substrate support and the substrate or may not timely reflect changes in the substrate temperature, such temperature spikes. This is especially problematic in processes, such as PECVD processes, where a low pressure atmosphere in a processing volume of the processing chamber results poor thermal conduction between a dielectric material of the substrate support and the substrate. Further, conventional direct substrate temperature measuring systems are unsuitable for the higher substrate temperatures reached during PECVD processes, for example 550° C. or more, as the fiber optic components thereof are unable to withstand such high temperature applications. Therefore, embodiments provided herein allow for direct monitoring of a substrate's temperature during plasma processing thereof at relatively high processing temperatures, such as temperatures more than about 100° C. In particular, embodiments herein allow for direct measurements of the temperature of a non-active surface of the substrate disposed on the substrate support using a temperature monitoring system disposed in and, or, extending through the substrate support assembly.

Figure 1:
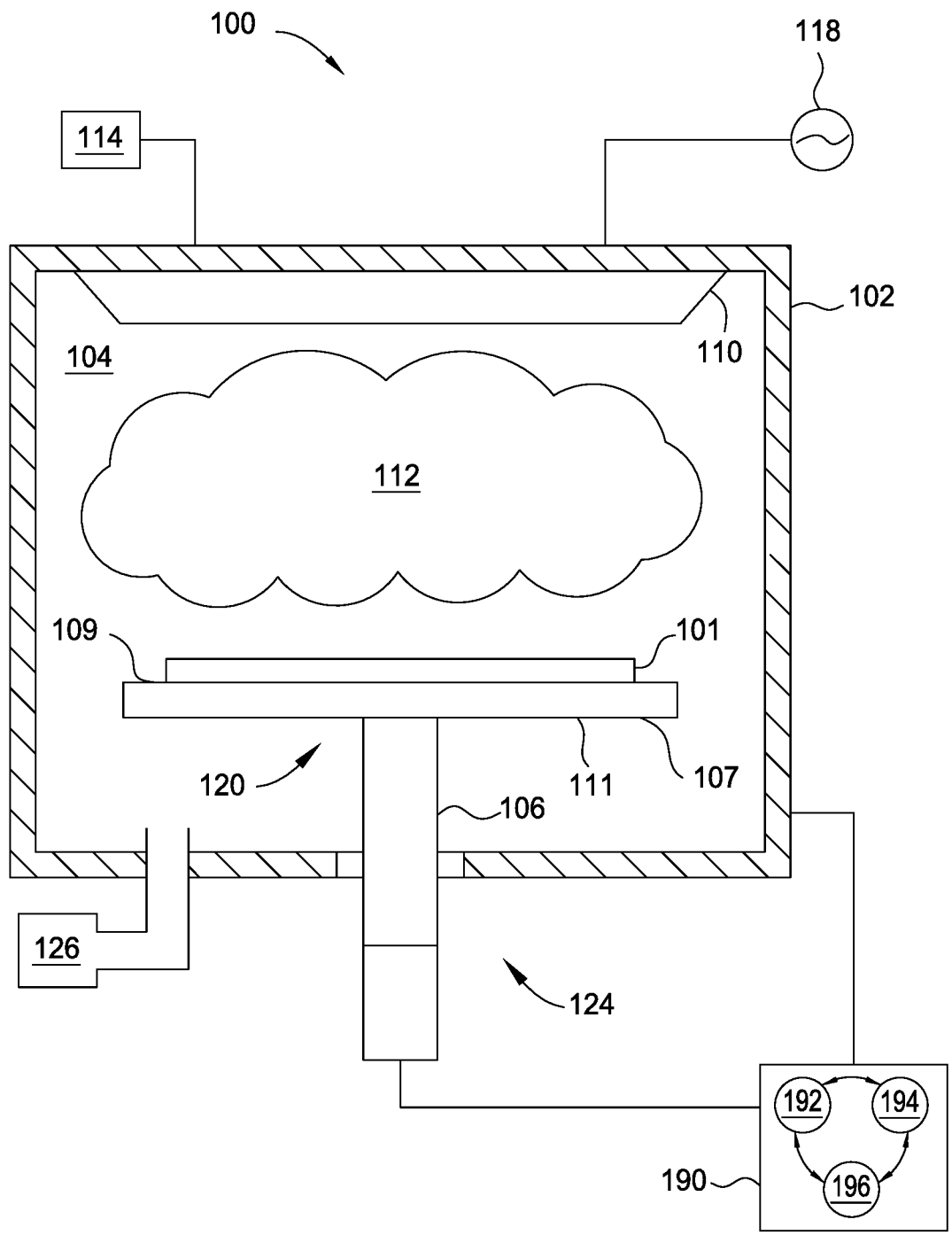
FIG. 1 is a schematic cross sectional view of an exemplary plasma processing chamber used to practice the methods set forth herein, according to one embodiment.

FIG. 1 is a schematic cross sectional view of an exemplary plasma processing chamber used to practice the methods set forth herein, according to one embodiment. Other exemplary deposition chambers that may be used to practice the methods describe herein include a Producer® ETERNA CVD® system or an Ultima HDP CVD® system, both available from Applied Materials, Inc., of Santa Clara, Calif. as well as suitable deposition chambers from other manufacturers.

The processing chamber 100 includes a chamber body 102 which defines a processing volume 104, a showerhead 110 disposed in the processing volume 104, and a substrate support assembly 120 disposed in the processing volume 104 facing the showerhead 110. The showerhead 110, having a plurality of openings (not shown) disposed therethrough, is used to distribute processing gases, from the gas source 114, into the processing volume 104. Herein, the showerhead 110 is electrically coupled to a power supply 118, such as an RF or other ac frequency power supply, which supplies power to ignite and maintain a plasma 112 of the processing gases through capacitive coupling therewith. In other embodiments, the processing chamber 100 comprises an inductive plasma generator and the plasma is formed through inductively coupling an RF power to the processing gas.

Herein, the substrate support assembly 120 includes a movable support shaft 106 sealingly extending through a base wall of the chamber body 102, such as being surrounded by bellows (not shown) in the region below the chamber base, and a substrate support 107 disposed on the support shaft 106 and coupled thereto. The substrate support 107 features a first surface, herein a substrate receiving surface 109, and a second surface 111 opposite the first surface. In some embodiments, the substrate 101, disposed on the substrate support 107, is maintained at a desired processing temperature, or within a range of desired processing temperatures, using one or both of a heater (not shown), such as a resistive heating element, and one or more cooling channels (not shown) disposed in the substrate support 107. Typically, the one or more cooling channels are fluidly coupled to a coolant source (not shown), such as a modified water source having relatively high electrical resistance or a refrigerant source.

The processing volume 104 is fluidly coupled to a vacuum source 126, such as to one or more dedicated vacuum pumps, which maintains the processing volume 104 at sub-atmospheric conditions and evacuates processing gas and other gases therefrom. Typically, a lift pin system (not shown) facilitates transfer of a substrate 101 to and from the substrate support 107 by enabling access to the substrate 101 by a robot handler. The substrate 101 is transferred into and out of the processing volume 104 through an opening (not shown) in a sidewall of the chamber body 102 which is sealed with a door or a valve (not shown) during substrate processing.

Herein, the processing chamber 100 further includes a controller 190 coupled thereto. The controller 190 includes a programmable central processing unit (CPU) 192 that is operable with a memory 194 and a mass storage device, an input control unit, and a display unit (not shown), such as power supplies, clocks, cache, input/output (I/O) circuits, and the liner, coupled to the various components of the processing system to facilitate control of the substrate processing.

To facilitate control of the processing chamber 100 described above, the CPU 192 may be one of any form of general purpose computer processor that can be used in an industrial setting, such as a programmable logic controller (PLC), for controlling various chambers and sub-processors. The memory 194 is coupled to the CPU 192 and the memory 194 is non-transitory and may be one or more of readily available memory such as random access memory (RAM), read only memory (ROM), floppy disk drive, hard disk, or any other form of digital storage, local or remote. Support circuits 196 are coupled to the CPU 192 for supporting the processor in a conventional manner. Instructions for controlling the operation of the processing chamber 100 are stored in the memory 194, typically as software routine. The software routine may also be stored and/or executed by a second CPU (not shown) that is remotely located from the processing chamber 100 being controlled by the CPU 192.

The memory 194 is in the form of computer-readable storage media that contains instructions, that when executed by the CPU 192, facilitates the operation of the processing chamber 100. The instructions in the memory 194 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figures 2A, 2B:
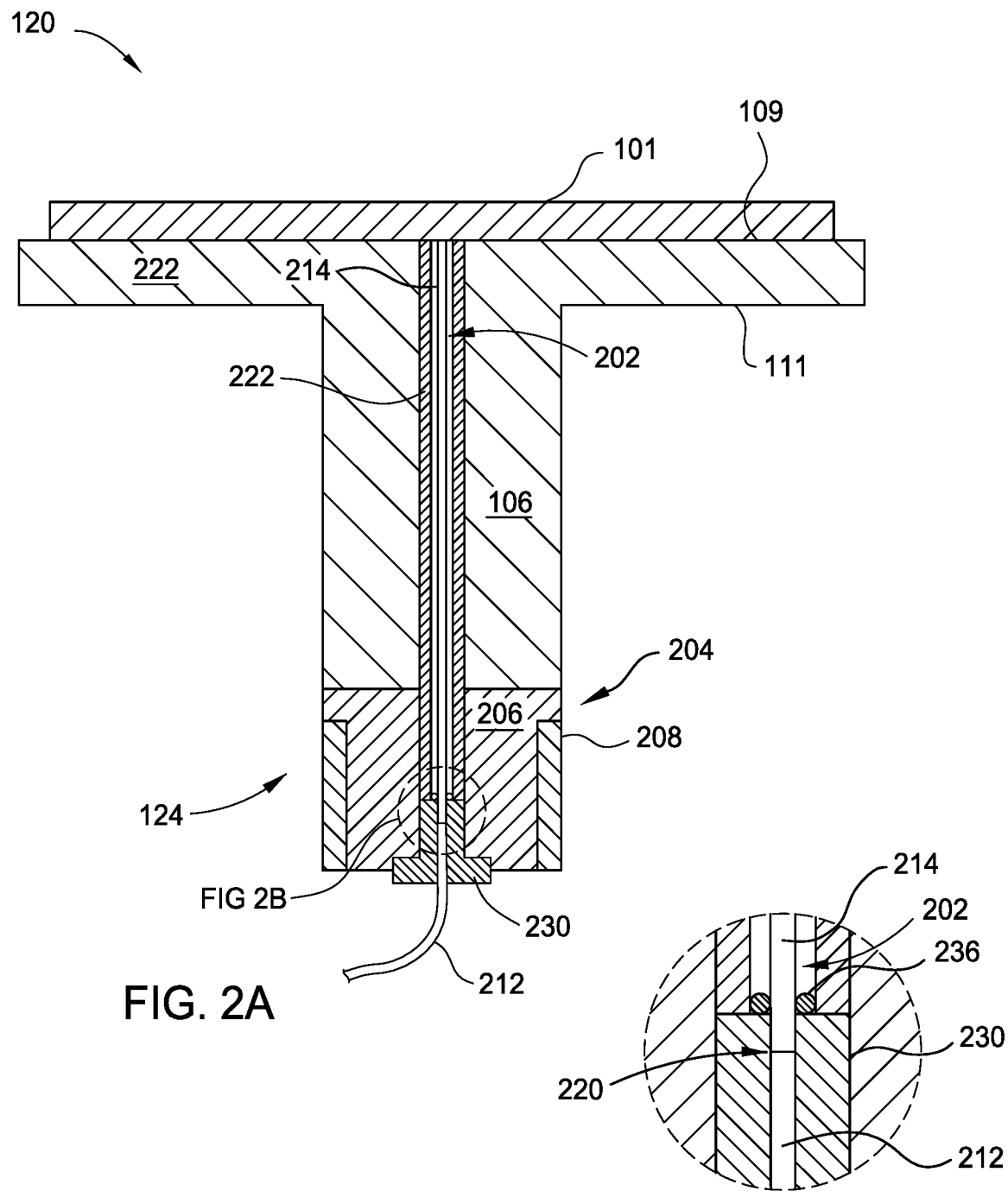
FIG. 2A is cross sectional view of the substrate support assembly from the plasma processing chamber of FIG. 1, according to one embodiment.
FIG. 2B is a close up view of a portion of the substrate support assembly shown in FIG. 2A.

Herein, the processing chamber 100 features a temperature monitoring system 124 integrated with the substrate support assembly 120, as further shown and described in FIGS. 2A-B.

FIG. 2A is a schematic cross sectional view of the substrate support assembly 120 of the processing chamber 100 shown in FIG. 1 having a temperature monitoring system 124 integrated therewith, according to one embodiment. FIG. 2B is a close up view of a portion of FIG. 2A. The temperature monitoring system 124 is used to directly measure the temperature of the substrate 101 disposed on the substrate support 107. The temperature monitoring system 124 herein includes an optical fiber tube 212 and a light guide 214. The optical fiber tube 212 is coupled to the light guide 214 using one or more fasteners 230, for example a nut having both the optical fiber tube 212 and the light guide 214 screwed thereinto at opposite ends thereof. The light guide 214 allows for the positioning of the optical fiber tube 212 at a location remote from the substrate 101 and the relativity high substrate processing temperatures associated therewith. Herein, the light guide 214 guides or directs an infrared (IR) beam emitted from the optical fiber tube 212 up the length of the support shaft 106 towards a non-active surface of the substrate 101 (i.e., the surface of the substrate in contact with the substrate support 107). The IR beam is reflected by the non-active surface of the substrate 101 and is directed back down to the optical fiber tube 212 through the light guide 214. In another embodiment, the optical fiber tube 212 is a passive optical fiber tube, and the light guide 214 is used to transmit or guide IR radiation emitted from the substrate 101 to the passive optical fiber tube. Herein, the optical fiber tube 212 is coupled to the controller 190 which determines the temperature of the substrate 101 based on the received IR beams emitted from or reflected by the non-active surface of the substrate 101. Typically, the light guide 214 is formed sapphire, such as a sapphire tube, or any other material suitable for directing IR light from the optical fiber tube 212 to the bottom of the substrate 101.

A junction of the optical fiber tube 212 and light guide 214, such as the fiber optic junction 220, is disposed in a cooling assembly 204 coupled to the support shaft 106. The cooling assembly 204 includes a temperature monitoring system adaptor, such as the adaptor 206, for integrating the temperature monitoring system 124 with the substrate support assembly 120, and a cooling jacket 208 disposed about the adaptor 206. During substrate processing, the cooling assembly 204 is used to maintain the temperature of the optical fiber tube 212 at or below 110° C. which prevents damage to the optical fiber tube 212 from excessive or prolonged exposure to thermal energy from substrate processing temperatures up to, and in some embodiments, more than about 550° C.

Herein, at least a portion of the light guide 214 is disposed in an opening 202 which extends through the support shaft 106 and at least partially through the substrate support 107.

In some embodiments, the opening 202 extends through the substrate support 107, for example through the substrate receiving surface 109 thereof. Typically, the opening 202 further extends through, or extends partially through, the cooling assembly 204, so that a continuous passage extends from the cooling assembly 204 to at least partially through the substrate support 107, and in some embodiments, to the substrate receiving surface 109 of the substrate support. Herein, the opening 202 is isolated from atmospheric conditions outside the processing volume 104 by a vacuum seal 236, such as an O-ring, located proximate to the fiber optic junction 220. The fiber optic junction 220 is isolated from the processing conditions in the processing volume 104 and the temperatures associated therewith.

Typically, an end of the light guide 214 proximate to the substrate 101 is positioned so that radiation, such as IR radiation, reflected by and, or, emitted from the substrate 101 is received into the light guide 214 and that radiation reflected by or emitted by other surfaces, such as surfaces of the support shaft 106 and, or, the substrate support 107 is not. In some embodiments, the light guide 214 extends from the fiber optic junction 220 to the substrate receiving surface 109 of the substrate support 107 so that the an end of the light guide 214 is flush with or just below the substrate receiving surface 109. In some embodiments, the light guide 214 extends to within about 1 mm, such as within about 0.5 mm, of the substrate receiving surface 109 so that the end of the light guide 214 is spaced apart from a substrate positioned on the substrate support 107 by between about 0 mm and about 1 mm, or between about 0 mm and about 0.5 mm, or less than about 0.5 mm. In some embodiments, the substrate support 107 further includes a window (not shown) disposed below or flush with the substrate receiving surface 109 and the light guide 214 extends to the window or within 1 mm thereof, such as within 0.5 mm thereof. Typically, the window is formed of a corrosion resistant material transparent to IR radiation, such as sapphire, yttrium, or quartz. In some embodiments, the window is integrally formed with substrate receiving surface 109 of the substrate support 107. Positioning the end of the light guide 214 within about 1 mm, such as within about 0.5 mm, from the non-active surface of a substrate 101 disposed on the substrate support 107 desirably improves the accuracy of substrate temperature measurement to within about 2° C. for substrate temperatures of more than about 250° C.

In some embodiments, the temperature monitoring system 124 further includes a protective sheath 222 circumscribing the light guide 214, and protecting the light guide 214 from breakage by restricting the lateral movement thereof in the opening 202. Typically, the sheath 222 is formed from the same or similar material as the support shaft 106, such as alumina. In some embodiments, the light guide 214 has a length of at least about 380 mm, for example at least about 400 mm. In some embodiments, the light guide 214 has an inner diameter of at least about 40 mm, such at least about 50 mm, at least about 60 mm, for example at least about 70 mm, or at least about 80 mm.

Figure 3:
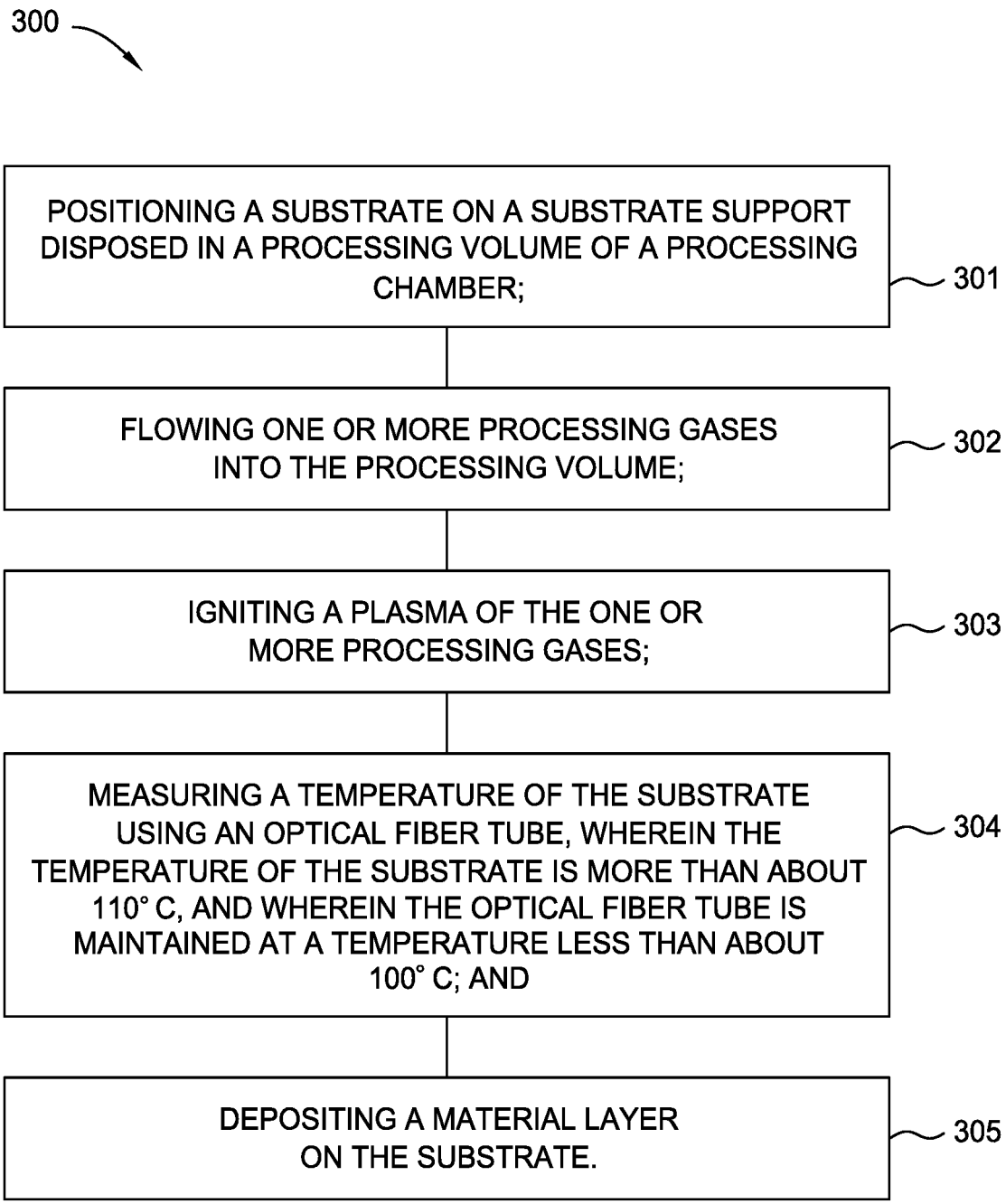
FIG. 3 is a flow diagram illustrating a method of processing a substrate, according to one embodiment.

FIG. 3 is a flow diagram illustrating a method of processing a substrate, according to one embodiment. At activity 301, the method 300 includes positioning the substrate on a substrate support disposed in a processing volume of a processing chamber, such as the processing chamber 100 described in FIG. 1 and the substrate support described in FIGS. 1 and 2A-2B.

At activity 302, the method 300 includes flowing one or more processing gases into the processing volume. Typically, the one or more processing gases comprise one or more material deposition precursor gases. The one or more material deposition precursor gases are flowed into the processing volume concurrently, sequentially, or a combination thereof. In some embodiments, the one or more processing gases further comprise a diluent gas, for example a noble gas, $N_2$, or a combination thereof. At activity 303, the method 300 includes igniting and maintaining a plasma of the processing gases.

At activity 304, the method 300 includes measuring a temperature of the substrate using an optical fiber tube. Herein, the temperature of the substrate reaches or exceeds about 110° C. during substrate processing, such as more than about 150° C., more than about 200° C., more than about 250° C., more than about 300° C., more than about 350° C., more than about 400° C., more than about 450° C., more than about 500° C., for example more than about 550° C. Typically, the optical fiber tube is maintained at a temperature of less than about 100° C. to prevent damage to thereto during the method 300.

At activity 305 the method 300 includes depositing a material layer on the substrate. Herein, the material layer comprises the reactive product of the one or more material deposition precursor gases on or with the active surface of the substrate. In some embodiments, the method 300 further includes maintaining the processing volume at a processing pressure of less than about 10 Torr.

In some embodiments, measuring the temperature of the substrate includes directing IR radiation emitted by and, or, reflected from a non-active surface of the substrate through a light guide coupled to the optical fiber tube. In some embodiments, maintaining the optical fiber tube at a temperature of less than about 100° C. includes maintaining a junction of the light guide and the optical fiber tube at a temperature of less than about 100° C. In some embodiments, the method 300 further includes emitting an IR beam from the optical fiber tube and directing the IR beam towards the non-active surface of the substrate through the light guide.

In some embodiments, measuring the temperature of the substrate includes communicating optical information received by the optical fiber tube, such as IR radiation reflected by and, or, emitted by the substrate, to a controller coupled to the processing chamber. In some embodiments, the method further includes monitoring the temperature of the substrate and changing one or more substrate processing conditions based thereon. For example, in some embodiments, the method includes changing one or more substrate processing conditions responsive to determining that the temperature of the substrate exceeds a threshold value. In some embodiments, the threshold value is a percentage increase in temperature that is indicative of a spike, such as more than about 20% of a typical mean substrate processing temperature, such as more than about 30% of typical mean substrate processing temperature, or other thresholds indicative of an undesirable spike in substrate temperature. In some embodiments, changing one or more processing conditions includes changing one of processing gas flow rates, a substrate processing time, processing pressure of the processing volume, temperature of the substrate support, power provided to the showerhead, stopping processing of the substrate, starting a new processing sequence for the substrate, or a combination thereof. In some embodiments, monitoring the temperature of the substrate includes collecting substrate temperature information that can be stored on the system controller or a fab level software in communication therewith, for example for statistical analysis or statistical process control (SPC) purposes. In some embodiments, the method further includes alerting a user to an out-of-control event, such as when a temperature of the substrate exceeds a threshold value, using any form of alert designed to communicate the out-of-control event to a desired user, including visual and audio alarms.

The embodiments described herein provide for the direct measurement and monitoring of substrate temperature in high temperature processing environments associated with PECVD processes, such as temperatures of 550° C. or more. Direct monitoring of substrate temperature beneficially enables improved process control methods as well as provides data that can be used to ensure stable and repeatable processing system performance.

While the foregoing is directed to specific embodiments, other and further embodiments may be devised without departing from the basic scope thereof, and the scope thereof is determined by the claims that follow.

What is claimed is:

1. A substrate support assembly, comprising:
   a support shaft;
   a substrate support disposed on the support shaft; and
   a substrate temperature monitoring system for measuring a temperature of a substrate to be disposed on the substrate support, comprising:
   an optical fiber tube;
   a light guide coupled to the optical fiber tube, wherein the light guide comprises a sapphire tube having a length of at least about 400 mm and an inner diameter of at least 40 mm, and at least a portion of the light guide is disposed in an opening extending through the support shaft and into the substrate support; and
   a cooling assembly disposed about a junction of the optical fiber tube and the light guide, wherein the cooling assembly maintains the optical fiber tube at a temperature of less than about 100° C. during substrate processing.

2. The substrate support assembly of claim 1, wherein the substrate temperature monitoring system further comprises:
   a sheath disposed in the opening to protect the light guide from breakage by restricting lateral movement thereof.

3. The substrate support assembly of claim 2, wherein the sheath comprises the same material as the support shaft.

4. The substrate support assembly of claim 1, wherein an end of the light guide is within 1 mm of a substrate when a substrate is disposed on the substrate support.

5. The substrate support assembly of claim 1, wherein the junction of the optical fiber tube and the light guide is isolated from the opening by a vacuum seal.

6. The substrate support assembly of claim 1, wherein the substrate support further comprises a window positioned flush with or below a substrate receiving surface of the substrate support.

7. The substrate support assembly of claim 6, wherein the light guide extends to within 0.5 mm of the window.

8. A processing chamber, comprising:
   a chamber body defining a processing volume; and
   a substrate support assembly disposed in the processing volume, the substrate support assembly comprising:
   a support shaft;
   a substrate support disposed on the support shaft;
   a substrate temperature monitoring system for measuring a temperature of a substrate to be disposed on the substrate support, comprising:
   an optical fiber tube;
   a light guide coupled to the optical fiber tube, wherein the light guide comprises a sapphire tube having a length of at least 400 mm and an inner diameter of at least about 40 mm, and at least a portion of the light guide is disposed in an opening extending through the support shaft and into the substrate support; and a cooling assembly disposed about a junction of the optical fiber tube and the light guide, wherein the cooling assembly maintains the optical fiber tube at a temperature of less than about 100° C. during substrate processing.

9. The processing chamber of claim 8, wherein the substrate temperature monitoring system further comprises:
a sheath disposed in the opening to protect the light guide from breakage by restricting lateral movement thereof.

10. The processing chamber of claim 8, wherein an end of the light guide is within 1 mm of a substrate when a substrate is disposed on the substrate support.

11. The processing chamber of claim 8, wherein the junction of the optical fiber tube and the light guide is isolated from the opening by a vacuum seal.

12. The processing chamber of claim 8, wherein the substrate support further comprises a window positioned flush with or below a substrate receiving surface of the substrate support.

13. The processing chamber of claim 8, further comprising a computer readable medium having instructions stored thereon for a method of processing a substrate, the method comprising:

positioning the substrate on a substrate receiving surface of the substrate support;

flowing one or more processing gases into the processing volume;

forming a plasma of the one or more processing gases;

heating the substrate to a temperature of 500° C. or greater;

measuring a temperature of the substrate using the optical fiber tube when the temperature of the substrate reaches or exceeds 500° C.; and depositing a material layer on the substrate.

14. The processing chamber of claim 13, wherein the method of processing the substrate further comprises maintaining the optical fiber tube at a temperature less than about 100° C.

* * * * *